(12) United States Patent
Albers et al.

(10) Patent No.: US 9,515,049 B2
(45) Date of Patent: Dec. 6, 2016

(54) FLEXIBLY-WRAPPED INTEGRATED CIRCUIT DIE

(71) Applicant: Intel Corporation, Santa Clara, CA (US)

(72) Inventors: Sven Albers, Regensburg (DE); Michael Skinner, San Jose, CA (US); Hans-Joachim Barth, Munich (DE); Peter Baumgartner, Munich (DE); Harald Gossner, Riemerling (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/368,434

(22) PCT Filed: Dec. 19, 2013

(86) PCT No.: PCT/US2013/076397
§ 371 (c)(1),
(2) Date: Jun. 24, 2014

(87) PCT Pub. No.: WO2015/094259
PCT Pub. Date: Jun. 25, 2015

(65) Prior Publication Data
US 2015/0214188 A1  Jul. 30, 2015

(51) Int. Cl.
*H01L 25/065* (2006.01)
*H01L 23/552* (2006.01)
(Continued)

(52) U.S. Cl.
CPC ....... *H01L 25/0652* (2013.01); *H01L 23/5226* (2013.01); *H01L 23/5227* (2013.01); *H01L 23/552* (2013.01); *H01L 23/562* (2013.01); *H01L 23/564* (2013.01); *H01L 24/17* (2013.01); *H01L 24/49* (2013.01); *H01L 24/81* (2013.01); *H01L 24/85* (2013.01); *H01L 25/065* (2013.01); *H01L 27/0207* (2013.01);
(Continued)

(58) Field of Classification Search
CPC .................................................. H01L 25/0652
See application file for complete search history.

(56) References Cited

U.S. PATENT DOCUMENTS 5,440,171 A * 8/1995 Miyano ................. H01L 25/105
257/700
6,417,027 B1 * 7/2002 Akram ................. H01L 23/5387
257/724

(Continued)

FOREIGN PATENT DOCUMENTS

| JP | 2001284564 A | 10/2001 |
| WO | WO-2012154211 A1 | 11/2012 |
| WO | WO-2015094259 A1 | 6/2015 |

OTHER PUBLICATIONS

"Germany Application Serial No. 102014116930.1, Office Action mailed Jul. 30, 2015", W/ No English Translation, 12 pgs.

(Continued)

*Primary Examiner* — Matthew Reames
*Assistant Examiner* — Vincent Wall
(74) *Attorney, Agent, or Firm* — Schwegman Lundberg & Woessner, P.A.

(57) ABSTRACT

Embodiments of a flexibly-wrapped integrated circuit die device and a method for mounting a flexibly-wrapped integrated circuit die to a substrate are disclosed. In some embodiments, the flexibly-wrapped integrated circuit die device includes a substrate and a flexible integrated circuit die coupled to the substrate in a substantially vertical orientation with reference to a surface of the substrate.

7 Claims, 8 Drawing Sheets

(51) Int. Cl.
  *H01L 23/522*  (2006.01)
  *H01L 29/06*   (2006.01)
  *H01L 23/00*   (2006.01)
  *H01L 27/02*   (2006.01)

(52) U.S. Cl.
  CPC  *H01L 29/0657* (2013.01); *H01L 2224/16113* (2013.01); *H01L 2224/16225* (2013.01); *H01L 2224/4813* (2013.01); *H01L 2224/48091* (2013.01); *H01L 2224/48145* (2013.01); *H01L 2224/48225* (2013.01); *H01L 2224/49* (2013.01); *H01L 2224/81801* (2013.01); *H01L 2224/85801* (2013.01); *H01L 2225/0651* (2013.01); *H01L 2225/06506* (2013.01); *H01L 2924/00014* (2013.01); *H01L 2924/19104* (2013.01)

(56) References Cited

U.S. PATENT DOCUMENTS

| | | |
|---|---|---|
| 2003/0209792 A1 | 11/2003 | Takaishi |
| 2010/0112774 A1 | 5/2010 | Oh et al. |
| 2010/0129995 A1 | 5/2010 | Im et al. |
| 2011/0057284 A1 | 3/2011 | Brodie |
| 2011/0281407 A1 | 11/2011 | Forbes et al. |

OTHER PUBLICATIONS

"Germany Application Serial No. 102014116930.1, Response filed Aug. 24, 2015 to Office Action mailed Jul. 30, 2015", W/ English Claims, 10 pgs.

"International Application Serial No. PCT/US2013/076397, International Search Report mailed Sep. 18, 2014", 3 pgs.

"International Application Serial No. PCT/US2013/076397, Written Opinion mailed Sep. 18, 2014", 5 pgs.

\* cited by examiner

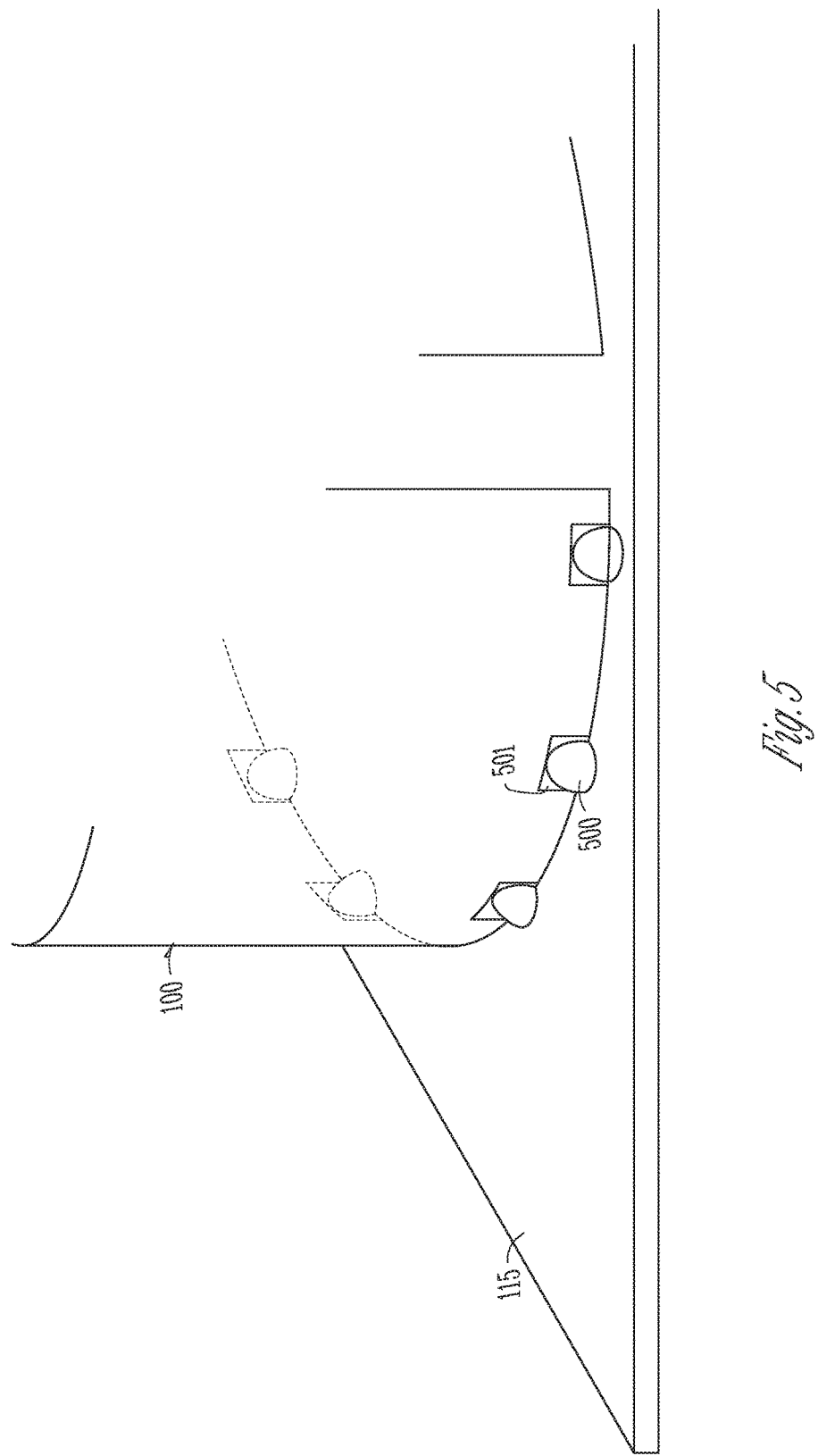

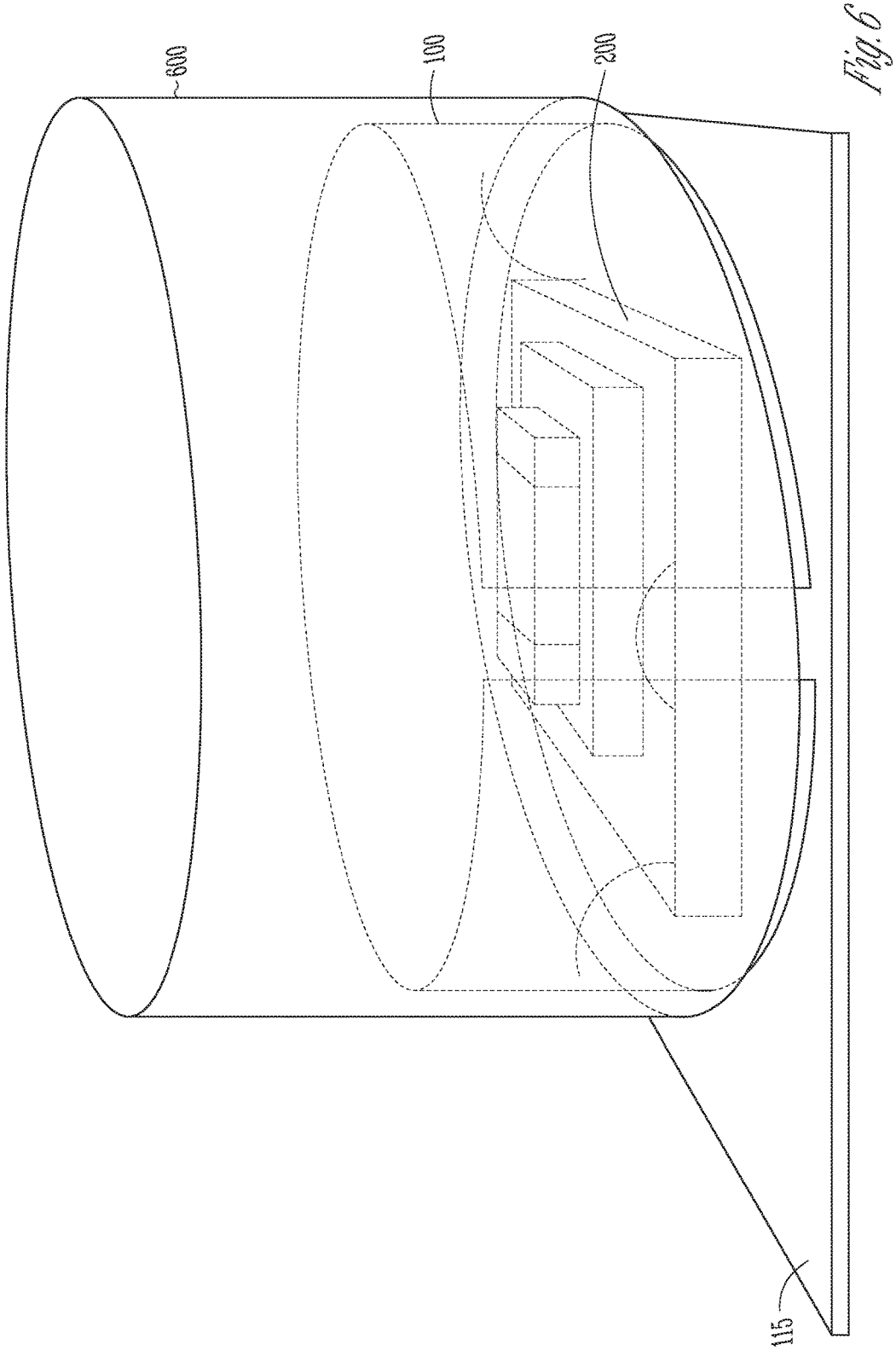

FLEXIBLY-WRAPPED INTEGRATED CIRCUIT DIE

This application is a U.S. National Stage Filing under 35 U.S.C. §371 from International Patent Application Serial No. PCT/US2013/076397, filed on Dec. 19, 2013, the benefit of priority of which is claimed hereby, and is incorporated by reference herein in its entirety.

TECHNICAL FIELD

Embodiments described herein generally relate to integrated circuits. Some embodiments relate to integrated circuit bonding.

BACKGROUND

As manufacturers attempt to reduce the size of electronic devices, they may find ways to combine integrated circuit dies in order to make the electronics of the device more compact. One typical way to connect multiple integrated circuit dies may be to stack the dies vertically as tiers, using vias to connect the circuitry between the tiers of dies. This may result in the heat generated by the circuitry of a lower substrate propagating upwards through the stacked dies. This may add to the heat already generated by the circuitry of the upper tiers of dies, thus decreasing the reliability of the upper tiers of dies.

Another method may locate dies side-by-side and use wire bonding to connect circuits between each. This may result in longer bond wires that may be more susceptible to breakage as well as a larger total package size.

There are general needs for combining multiple integrated circuits in a relatively small package.

BRIEF DESCRIPTION OF THE DRAWINGS

FIG. 5 illustrates an embodiment of the flexibly-wrapped integrated circuit die with edge connections.

FIG. 6 illustrates an embodiment of a method for connecting the flexibly-wrapped integrated circuit die to another substrate.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Subsequent discussions refer to integrated circuit dies. The term integrated circuit die may refer to not only the electrical circuitry but also any film, substrate (e.g., silicon), and/or other material used to mount the circuitry. Thus, as used herein, an integrated circuit die may include an electrical circuit formed on or as part of the substrate, the film, and/or any other material for mounting circuitry.

Multiple integrated circuit dies may be combined by stacking the integrated circuit dies vertically in a tiered structure. The integrated circuit dies may then use vias to connect circuitry on a first tier to circuitry on other tiers that are above and/or below the first tier.

This orientation may result in heat from circuitry operating on a lower integrated circuit die propagating through the upper integrated circuit dies. When this additional heat is added to the heat of the operating circuitry of the upper integrated circuit dies, it may result in heat-related problems and increased failure rates for circuit elements in the upper integrated circuit dies.

These problems may be reduced by wrapping a relatively thin, vertically oriented integrated circuit die around one or more horizontally oriented integrated circuit dies. For example, by reducing the thickness of a flexibly-wrapped integrated circuit die to a thickness that enables it to bend and flex (e.g., for Si dies less than 50 µm thick; for other die or die substrate materials, different thickness limits may apply), the flexibly-wrapped integrated circuit die may be bonded in the vertical orientation peripherally around the edges of one or more horizontally oriented integrated circuit dies. Heat produced by circuitry on the flexibly-wrapped integrated circuit die may be emitted upwards and away from the horizontally oriented integrated circuit die(s).

While reference is made herein to the vertically oriented, flexibly-wrapped integrated circuit die and the horizontally oriented integrated circuit die(s) (and the substrate to which the die(s) are attached), the present embodiments are not limited to an exactly orthogonal relationship between the two dies. For example, the vertically oriented, flexibly-wrapped integrated circuit die may be at an angle other than 90° in relation to the substrate or package to which it is mounted and to the integrated circuit die(s) around which the flexibly-wrapped integrated circuit die may be peripherally wrapped.

Figure 1:
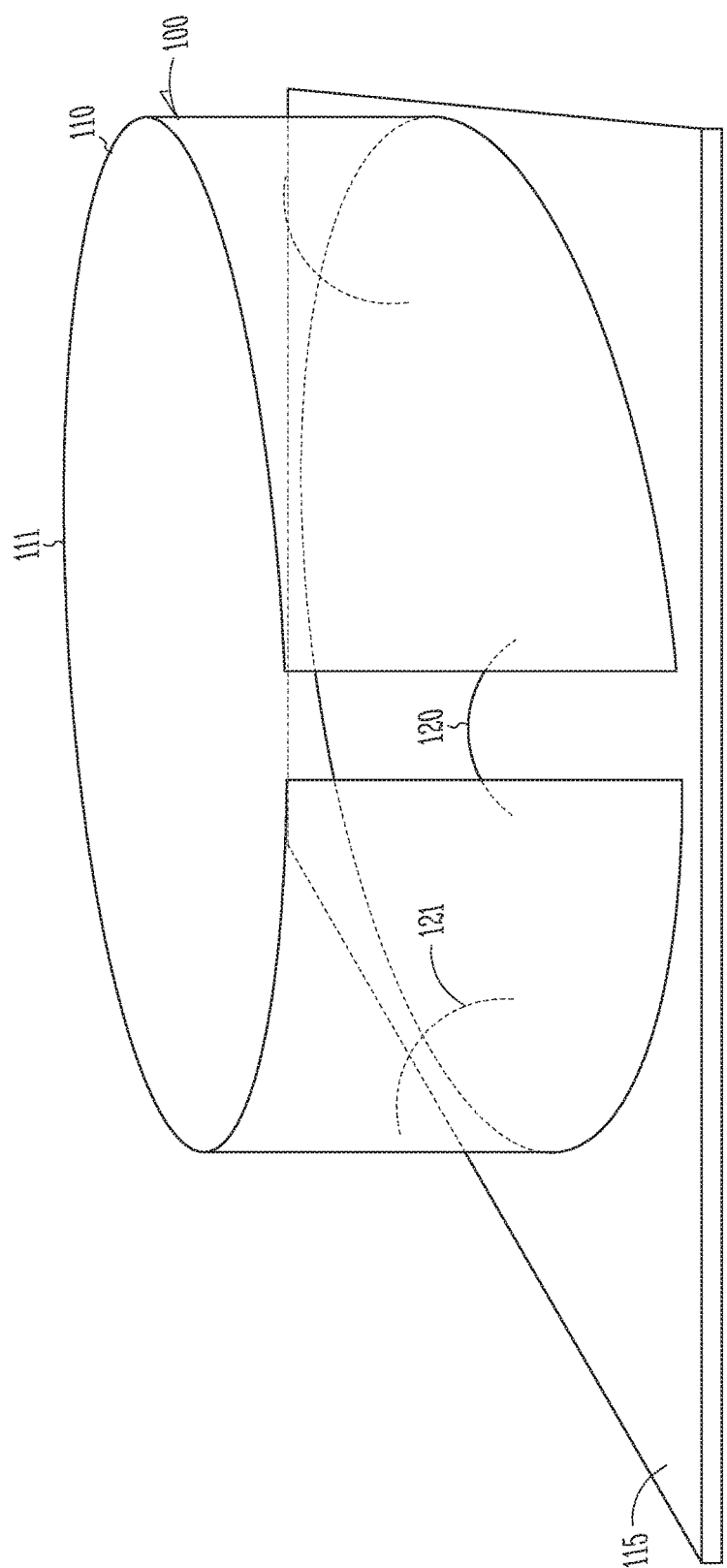
FIG. 1 illustrates an embodiment of a flexibly-wrapped integrated circuit die.

FIG. 1 illustrates an embodiment of a flexibly-wrapped integrated circuit die 100 device. The device may include the flexibly-wrapped integrated circuit die 100 mounted on a substrate or package 115.

The flexibly-wrapped integrated circuit die 100 may have a reduced thickness in order to enable it to bend enough to be formed in an arc, a circular segment, a circle, an oval, or some other shape. The flexibly-wrapped integrated circuit die 100 may comprise a circuit (e.g., traces, vias, electronic components) formed on or part of a film, a substrate (e.g., silicon, germanium), or some other die material.

The flexibly-wrapped integrated circuit die 100 may be formed within the package 115 that may provide one or more of structural protection, environmental protection, shielding, and/or heat sink capabilities. The bottom of the package 115 may be a substrate or may be attached to a substrate. The package 115 may substantially enclose the flexibly-wrapped integrated circuit die 100 device.

FIG. 1 also illustrates that horizontally oriented integrated circuit dies may not be used in some embodiments. For example, the flexibly-wrapped integrated circuit die 100 may be formed substantially as shown without the horizontally oriented integrated circuit dies. In an embodiment, bonding wires 121 may couple circuitry from the flexibly-wrapped integrated circuit die 100 to the substrate or package 115 where a circuit may be mounted.

The the flexibly-wrapped integrated circuit die 100 may be formed in a complete circuit such that the ends of the flexibly-wrapped integrated circuit die 100 meet and may be connected together. Another embodiment may include a gap between the ends of the flexibly-wrapped integrated circuit die 100, such as the gap shown in FIG. 1. In such an embodiment, one or more bonding wires 120 may be used to bridge the gap and connect the circuitry if one or more circuits need to be completed. In another embodiment, the flexibly-wrapped integrated circuit die 100 may form only an arc or curved form.

In another embodiment, the flexibly-wrapped integrated circuit die 100 may comprise a segmented substrate material (e.g., a plurality of linked shorter segments) wherein each segment may not be thin enough to be flexible individually but together may mimic a flexibly-wrapped integrated circuit die 100. Another embodiment may use an integrated circuit die 100 that is initially flexible but may then be hardened into an arc, curve, or circular shape that is no longer flexible once formed in a desired shape and location.

One side of the flexibly-wrapped integrated circuit die 100 may be an active side 111 while the other side may be an inactive side 110. The active side may include a majority of the electronic circuitry that includes circuit traces, and/or circuit elements (e.g., transistors, interconnects, capacitors, resistors, logic elements). The inactive side 110 may include a lesser amount of the electronic circuitry.

Figure 2:
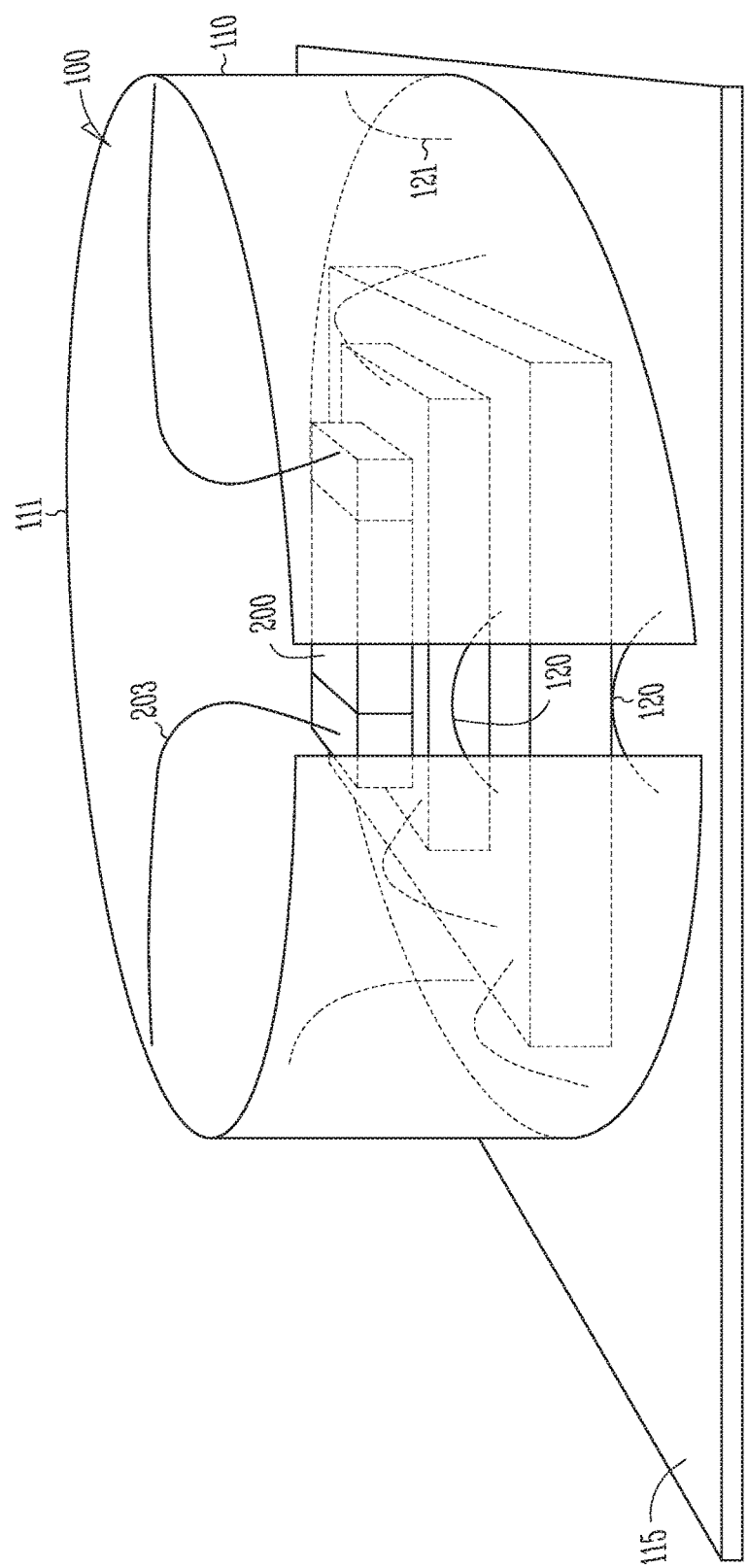
FIG. 2 illustrates an embodiment of the flexibly-wrapped integrated circuit die formed around a stack of integrated circuit dies.

FIG. 2 illustrates an embodiment of the flexibly-wrapped integrated circuit die 100 formed around horizontally oriented integrated circuit die(s) 200 (e.g., stack of integrated circuit dies, substrates, and/or electrical components). The stack of integrated circuit die(s) 200 may be coupled together mechanically as well as electrically through solder balls and bonding wires 205. Vias may electrically connect the circuits of the different tiers of dies and/or substrates. If the bottom of the package 115 comprises a substrate with a circuit, the horizontally oriented integrated circuit die(s) 200 may be coupled to that circuit with one or more bonding wires 205.

Circuitry on the active side 111 of the flexibly-wrapped integrated circuit die 100 may be coupled to the horizontally oriented integrated circuit die(s) 200 by one or more bonding wires 203. The circuitry on the active side 111 of the flexibly-wrapped integrated circuit die 100 may also be coupled to circuitry on the substrate and/or package 115 by one or more bonding wires 121.

Figure 3:
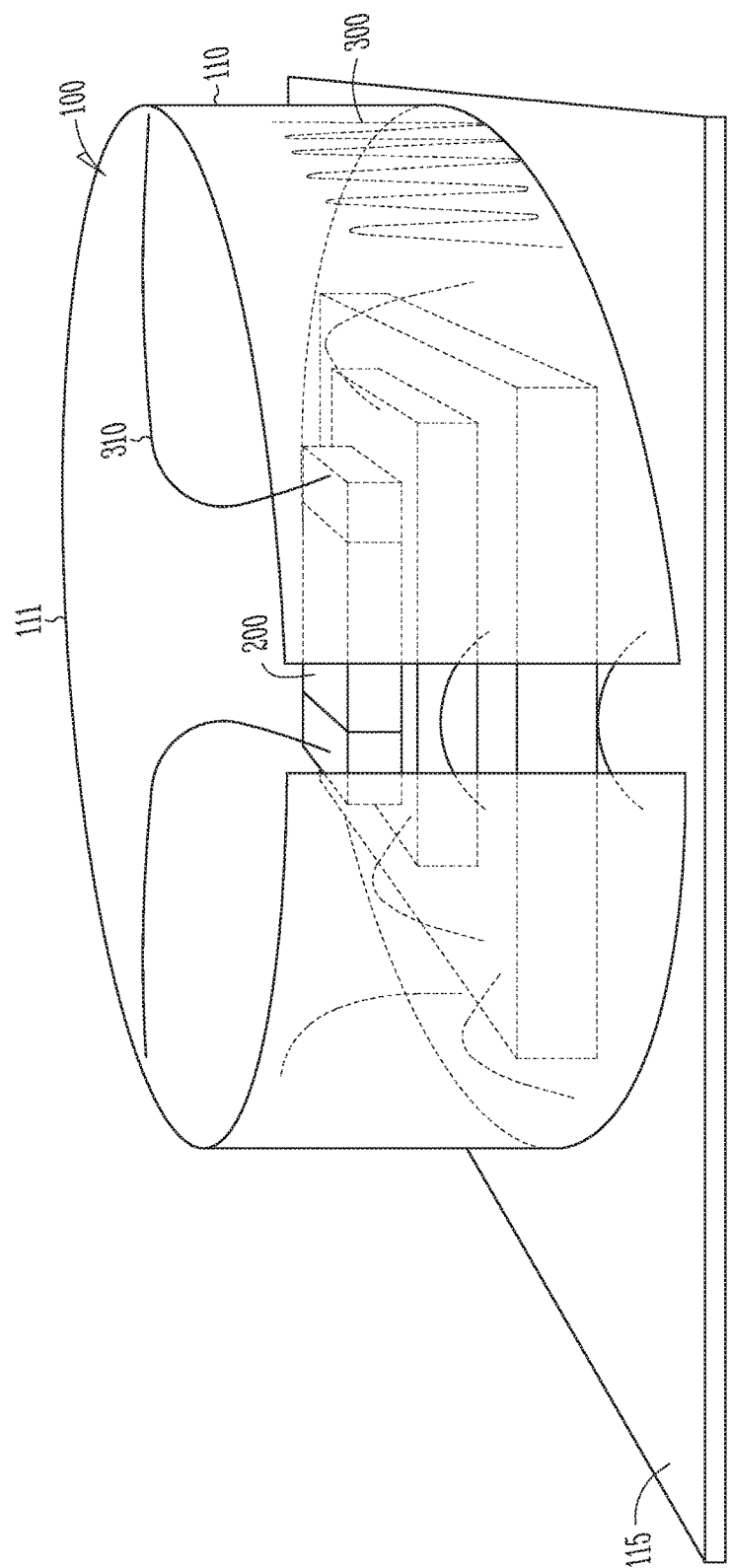
FIG. 3 illustrates an embodiment of the flexibly-wrapped integrated circuit die with an antenna.

FIG. 3 illustrates an embodiment of the flexibly-wrapped integrated circuit die 100 having an antenna 300. The antenna 300 may be mounted on the inactive side 110 (e.g., outer side) of the flexibly-wrapped integrated circuit die 100. The antenna 300 may be electrically coupled to circuitry on the active side 111 by a via or jumper wire. The antenna 300 may also be electrically coupled to the horizontally oriented integrated circuit die(s) 200 by a bonding wire 310 coupled to a via.

The antenna 300 may be configured to radiate a signal outwards thus leaving the horizontally oriented integrated circuit die(s) 200 undisturbed. This may be accomplished by forming a shield layer between the antenna 300 and the inactive side 110 of the flexibly-wrapped integrated circuit die 100. In an embodiment, the antenna 300 may be part of or combined with shielding 400 as illustrated in FIG. 4.

The antenna 300 may be a metal that has been formed on the flexibly-wrapped integrated circuit die 100 by an etching process or a metal deposition process. The antenna 300 may also be an antenna element that is electrically and/or mechanically bonded to the surface of the flexibly-wrapped integrated circuit die 100.

Figure 4:
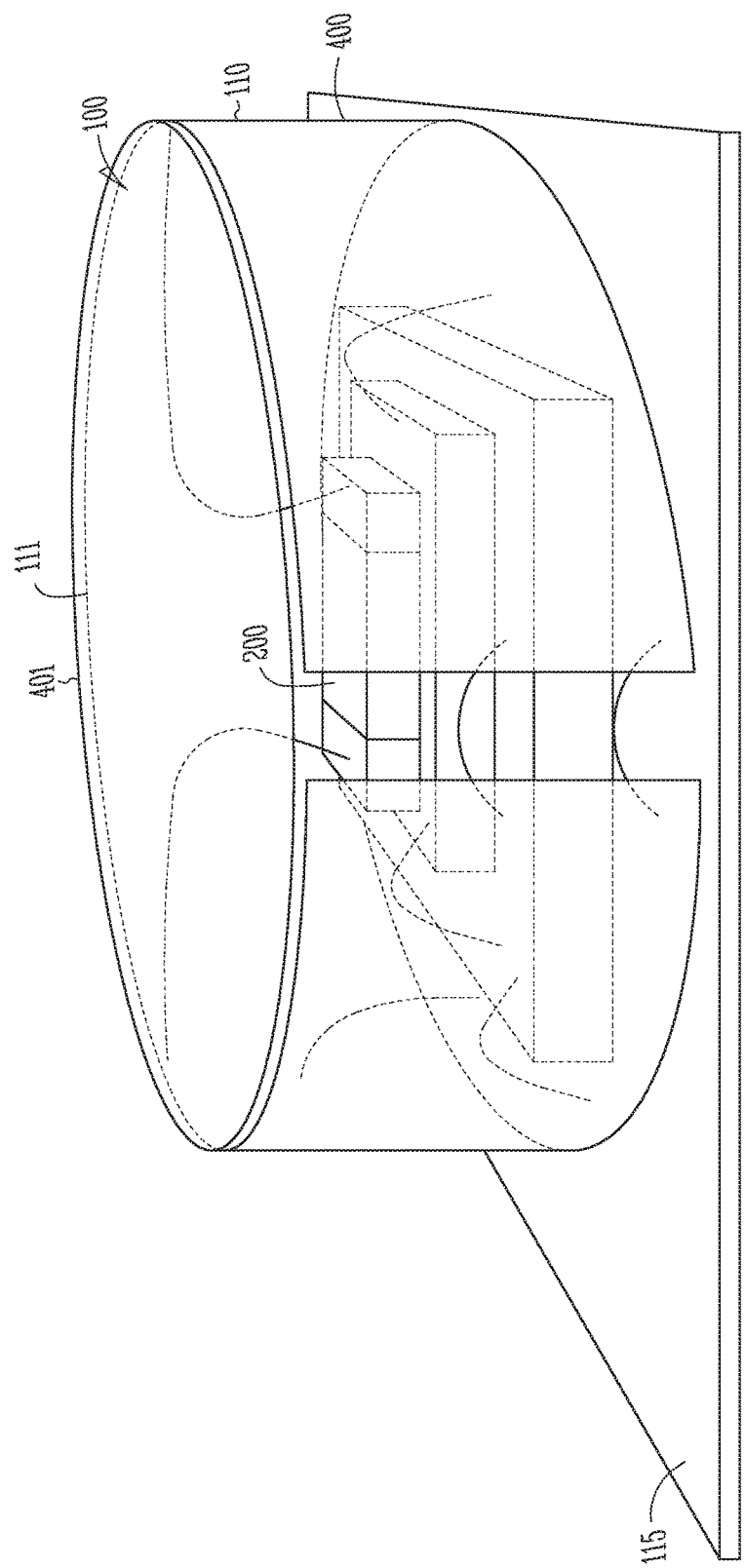
FIG. 4 illustrates an embodiment of the flexibly-wrapped integrated circuit die with shielding.

FIG. 4 illustrates an embodiment of the flexibly-wrapped integrated circuit die 100 having shielding 400, 401. The shielding 400, 401 may be a metal shielding and include shielding on both the inactive surface 110 of the flexibly-wrapped integrated circuit die 100 as well as covering the top 401 of the flexibly-wrapped integrated circuit die 100.

In an embodiment, only the inactive surface 110 of the flexibly-wrapped integrated circuit die 100 includes shielding 400. In another embodiment, only the top 401 of the flexibly-wrapped integrated circuit die 100 includes the shielding 401. As discussed previously with reference to FIG. 3, either the top shielding 401 or the side shielding 400 may include an antenna 300 formed into the shielding material.

In some embodiments, the flexibly-wrapped integrated circuit die 100 may be glued, soldered, or bonded in some manner to the package 115, as illustrated previously. FIG. 5 illustrates an embodiment of the flexibly-wrapped integrated circuit die 100 that is attached to the substrate or package 115 using edge connections.

For example, a plurality of solder areas (e.g., solder balls) may be attached to a top surface of the substrate or package 115 in a particular pattern. A lower edge of the flexibly-wrapped integrated circuit die 100 may have a plurality of landing pads 501 in the same particular pattern such that each landing pad corresponds to a solder ball location. The flexibly-wrapped integrated circuit die 100 may then be lowered on or near the top surface of the substrate or package 115 with the corresponding landing pads 501 matching up with the solder balls 500. When the assembly is heated, the solder balls 500 may melt and fuse to its associated landing pad when cooled, thus attaching the flexibly-wrapped integrated circuit die 100 to the substrate or package 115.

FIG. 6 illustrates an embodiment of a method for connecting the flexibly-wrapped integrated circuit die 100 to the substrate or package 115 or another substrate. A tube 600 may be used to substantially encircle the flexibly-wrapped integrated circuit die 100 either temporarily during attachment of the flexibly-wrapped integrated circuit die 100 to the package 115 or permanently bonded to the substrate or package 115. The tube 600 may be used during a wire bonding process to reduce cracks that may occur during the bonding process.

The tube 600 may include a material that enables it to act as a heat sink. For example, if the tube 600 is either a metal material or is surfaced with a metal material, the tube 600 may be mechanically coupled to the flexibly-wrapped integrated circuit die 100 and radiate heat away from the flexibly-wrapped integrated circuit die 100.

FIGS. 7A-7D illustrate embodiments of a method for creating a stacked stud connection 705 on a flexibly-wrapped integrated circuit die 100 and placing a bonding wire between the stacked stud 705 and a horizontally oriented integrated circuit die 710. The stacked stud connection 705 may reduce the complexity and increase the reliability of a wire bonding process since the wire bonding mechanisms may only have to move in a vertical direction. However, such an embodiment is for purposes of illustration only as another embodiment may bond wire to the flexibly-wrapped integrated circuit die 100 in a substantially horizontal direction as well.

Figures 7A, 7B:
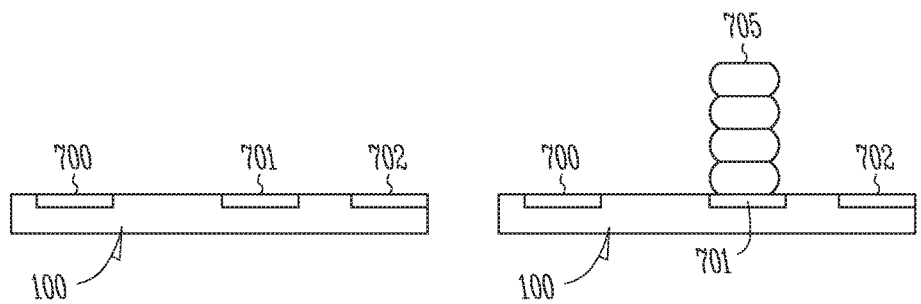
FIGS. 7A-7D illustrate embodiments of a stacked stud connection on a flexibly-wrapped integrated circuit die.

FIG. 7A illustrates an initial step with the flexibly-wrapped integrated circuit die 100 lying flat. The flexibly-wrapped integrated circuit die 100 comprises a plurality of solder pads 700-702. In an embodiment, the plurality of solder pads 700-702 are located on the active side 111 of the flexibly-wrapped integrated circuit die 100.

FIG. 7B illustrates a stack 705 of a plurality of solder balls (e.g., solder bumps) that are formed on one of the solder pads 701. In an embodiment, a metal cylinder or single solder cylinder may be used instead of the plurality of solder balls.

Figure 7C:
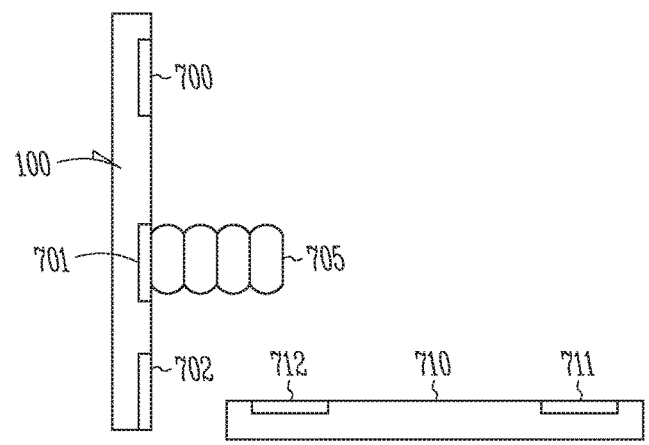

FIG. 7C illustrates the flexibly-wrapped integrated circuit die 100 being in a substantially vertical orientation and placed near a substantially horizontal integrated circuit die 710. The substantially horizontal integrated circuit die 710 may comprise a plurality of solder pads 711, 712.

Figure 7D:
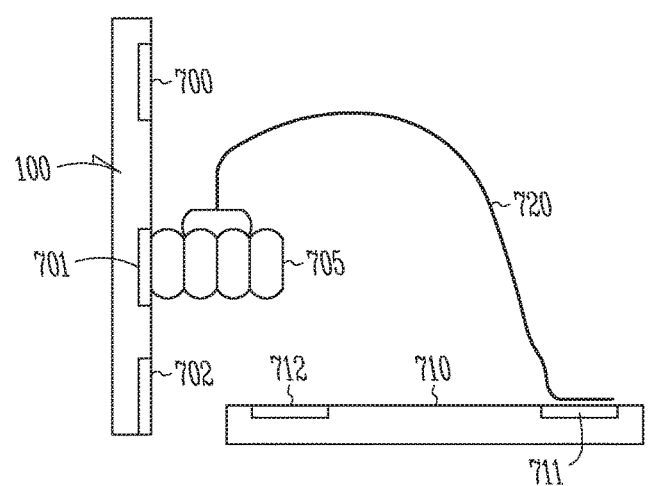

FIG. 7D illustrates a bonding wire 720 being attached to both the stack 705 and one of the solder pads 711 on the substantially horizontal integrated circuit die 710. The bonding of the wire 720 may use a well-known process of heating the solder, placing the wire 720, and letting the solder cool.

The wire bonding process of FIGS. 7A-7D is for purposes of illustration only. Other wire bonding processes may be used.

Figure 8:
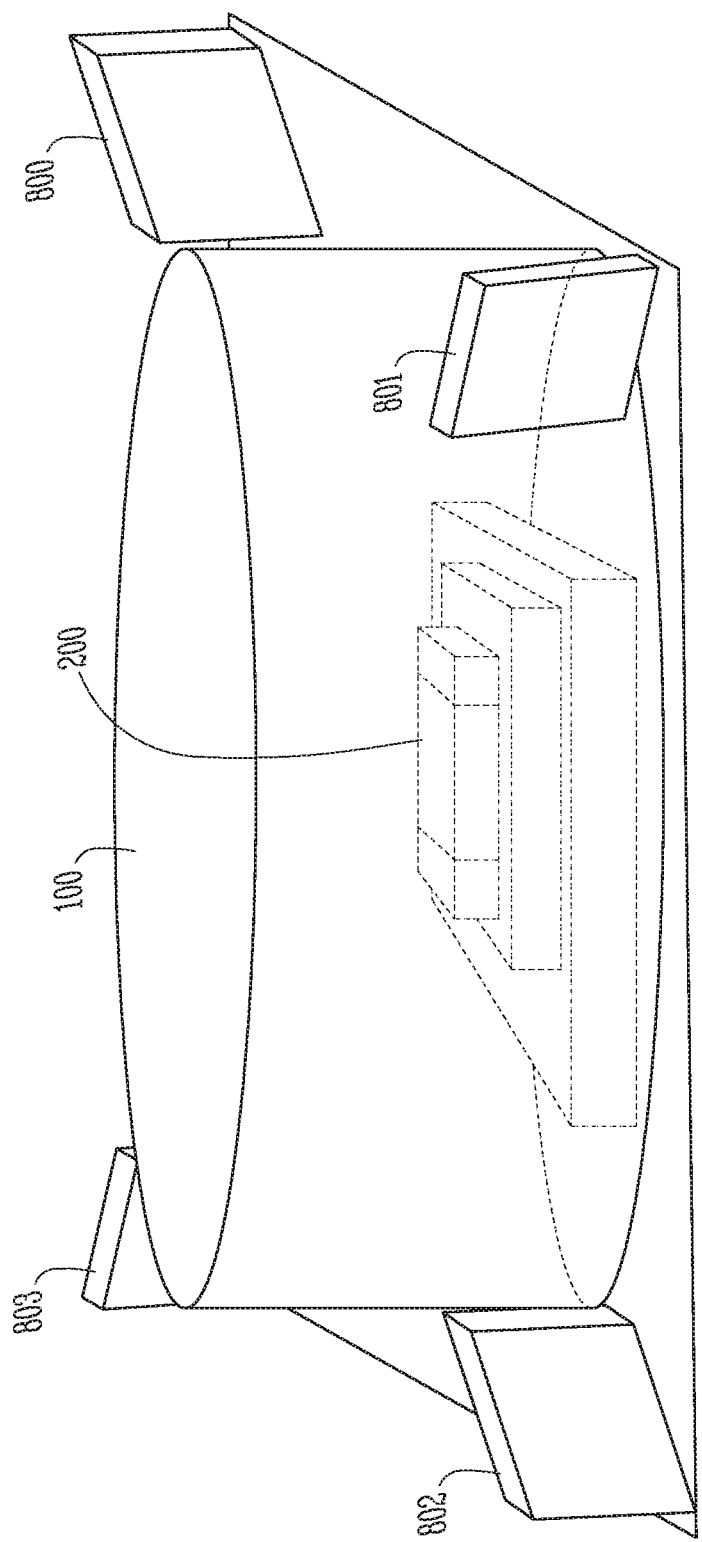
FIG. 8 illustrates an embodiment of alignment pillars.

FIG. 8 illustrates an embodiment of alignment pillars for aligning the flexibly-wrapped integrated circuit die 100 to the substrate or package 115 to which the flexibly-wrapped integrated circuit die 100 is coupled. The alignment pillars may comprise a plurality of pillars 800-803 located in corners of the package 115. Other embodiments may position more than four pillars 800-803 and/or in different locations than the corners of the package 115.

During the bonding process of the flexibly-wrapped integrated circuit die 100 to other substrates or the package 115, the flexibly-wrapped integrated circuit die 100 may be positioned within the alignment pillars 800-803. The alignment pillars 800-803 may then hold the flexibly-wrapped integrated circuit die 100 in that position until it is permanently attached to the package 115. For example, referring to FIG. 5, accurate alignment of the flexibly-wrapped integrated circuit die 100 may be desired due to the placement of the solder balls 500 and the landing pads 501. The pillars 800-803 may be removed after attachment of the flexibly-wrapped integrated circuit die 100 or left on the package 115 permanently.

If the alignment pillars 800-803 are left permanently, they may serve a purpose other than alignment. For example, the alignment pillars 800-803 may serve as heat sinks to remove heat from the flexibly-wrapped integrated circuit die 100, substrates, or the package 115. The alignment pillars 800-803 may also be used as antennas, selective shielding, and/or to modify an airflow (e.g., cooling fan airflow) around the assembly.

EXAMPLES

The following examples pertain to further embodiments.

Example 1 is an integrated circuit die device comprising a substrate and a flexible integrated circuit die coupled to the substrate in a substantially vertical orientation with reference to a surface of the substrate.

In Example 2, the subject matter of Example 1 can optionally include wherein the curved integrated circuit die comprises a segmented substrate material comprising a plurality of linked segments.

In Example 3, the subject matter of Examples 1-2 can optionally include wherein the curved integrated circuit die comprises an active side and an inactive side.

In Example 4, the subject matter of Examples 1-3 can optionally include wherein the active side comprises additional electronic circuitry with reference to the inactive side.

In Example 5, the subject matter of Examples 1-4 can optionally include bonding wires coupling electronic circuitry on the curved integrated circuit die to circuitry on the substrate.

In Example 6, the subject matter of Examples 1-5 can optionally include at least one integrated circuit die coupled to the substrate in a substantially horizontal orientation with reference to the flexible integrated circuit die, wherein the curved integrated circuit die wraps around at least a portion of the periphery of the at least one integrated circuit die.

In Example 7, the subject matter of Examples 1-6 can optionally include wherein electronic circuitry on the curved integrated circuit die is coupled to the at least one integrated circuit die with one or more bonding wires.

In Example 8, the subject matter of Examples 1-7 can optionally include wherein the curved integrated circuit die is coupled to the substrate in a circular pattern around the periphery of the at least one integrated circuit die.

In Example 9, the subject matter of Examples 1-8 can optionally include wherein ends of the curved integrated circuit die are coupled together.

In Example 10, the subject matter of Examples 1-9 can optionally include a shield formed on an inactive side of the curved integrated circuit die.

Example 11 is a flexibly-wrapped integrated circuit die device comprising: a substrate, an integrated circuit die coupled to the substrate, and a flexible integrated circuit die, the flexible integrated circuit die coupled to the substrate in a substantially vertical orientation with reference to a surface of the substrate wherein the flexible integrated circuit die substantially peripherally encircles the integrated circuit die.

In Example 12, the subject matter of Example 11 can optionally include wherein the integrated circuit die coupled to the substrate comprises a plurality of stacked integrated circuit dies.

In Example 13, the subject matter of Examples 11-12 can optionally include a tube coupled to the substrate and substantially encircling the flexible integrated circuit die.

In Example 14, the subject matter of Examples 11-13 can optionally include wherein the flexible integrated circuit die further comprises a plurality of landing pads arranged around a lower edge of the flexible integrated circuit die in a particular pattern, each landing pad coupled to a corresponding one of a plurality of solder balls coupled to the substrate in the particular pattern.

In Example 15, the subject matter of Examples 11-14 can optionally include wherein the substrate is part of a package that substantially encloses the flexibly-wrapped integrated circuit die device.

In Example 16, the subject matter of Examples 11-15 can optionally include alignment pillars coupled to the substrate and configured to align the flexible integrated circuit die to the substrate.

Example 17 is a method for mounting a flexibly-wrapped integrated circuit die to a substrate, the method comprising: providing a plurality of solder areas in a particular pattern on the substrate; aligning each of a plurality of landing pads, formed in the particular pattern on a lower edge of the flexibly-wrapped integrated circuit die, with an associated one of the plurality of solder areas; and causing each of the plurality of landing pads to fuse with its associated one of the plurality of solder areas.

In Example 18, the subject matter of Example 17 can optionally include stacked studs on the flexibly-wrapped integrated circuit die; and attaching bonding wires from the stacked studs to the substrate.

In Example 19, the subject matter of Examples 17-18 can optionally include wherein forming each of the stacked studs comprises stacking a plurality of solder balls on a solder pad of the flexibly-wrapped integrated circuit die.

In Example 20, the subject matter of Examples 17-19 can optionally include wherein aligning each of the plurality of landing pads comprises using alignment pillars on the substrate to align the flexibly-wrapped integrated circuit die with the particular pattern of solder areas on the substrate.

In Example 21, the subject matter of Examples 17-20 can optionally include wherein aligning each of the plurality of landing pads comprises forming the flexibly-wrapped integrated circuit die within a tube attached to the substrate.

In Example 22, the subject matter of Examples 17-21 can optionally include coupling ends of the flexible integrated circuit die together with one or more bonding wires.

Example 23 is a flexibly-wrapped integrated circuit die device comprising: a package having a substrate on a bottom surface; a flexible integrated circuit die, the flexible integrated circuit die coupled to the substrate in a substantially vertical orientation with reference to a surface of the substrate; and a shield coupled to the flexible integrated circuit die.

In Example 24, the subject matter of Example 23 can optionally include wherein the package substantially surrounds the flexible integrated circuit die.

In Example 25, the subject matter of Examples 23-24 can optionally include wherein the package comprises a heat sink capability.

In Example 26, the subject matter of Examples 23-25 can optionally include wherein the package comprises a shielding capability.

In Example 27, the subject matter of Examples 23-26 can optionally include wherein the shield comprises a shield wrapped around the flexible integrated circuit die on an inactive side of the flexible integrated circuit die.

In Example 28, the subject matter of Examples 23-27 can optionally include a top shield coupled to a top edge of the shield wrapped around the flexible integrated circuit die.

In Example 29, the subject matter of Examples 23-28 can optionally include alignment pillars coupled to the substrate, the alignment pillars comprising heat sink capabilities.

In Example 30, the subject matter of Examples 23-29 can optionally include alignment pillars coupled to the substrate, the alignment pillars comprising an antenna on at least one of the pillars.

In Example 31, the subject matter of Examples 23-30 can optionally include alignment pillars coupled to the substrate wherein the alignment pillars are configured to direct cooling air around the device.

Example 32 is a flexibly-wrapped integrated circuit die device comprising: a package having a substrate on a bottom surface; first means for mounting coupled in a pattern on a top surface of the substrate; and a flexible integrated circuit die having second means for mounting located along a lower edge in the pattern such that each of the second means for mounting corresponds to one of the first means for mounting, the flexible integrated circuit die coupled to the substrate in a substantially vertical orientation with reference to the top surface of the substrate.

In Example 33, the subject matter of Example 32 can optionally include 2 wherein the first means for mounting comprises a plurality of solder balls and the second means for mounting comprises a plurality of landing pads.

In Example 34, the subject matter of Examples 32-33 can optionally include wherein the flexible integrated circuit die has a thickness in a range of 2-25 mm.

In Example 35, the subject matter of Examples 32-34 can optionally include wherein the flexible integrated circuit die comprises an antenna.

What is claimed is:

1. A flexibly-wrapped integrated circuit die device comprising:
    a substrate;
    an integrated circuit die coupled to the substrate;
    a flexible integrated circuit die, the flexible integrated circuit die coupled to the substrate in a substantially vertical orientation with reference to a surface of the substrate wherein the flexible integrated circuit die substantially peripherally encircles the integrated circuit die; and
    a tube coupled to the substrate and substantially encircling the flexible integrated circuit die.

2. The flexibly-wrapped integrated circuit die device of claim 1 wherein the integrated circuit die coupled to the substrate comprises a plurality of stacked integrated circuit dies.

3. The flexibly-wrapped integrated circuit die device of claim 1 wherein the flexible integrated circuit die further comprises a plurality of landing pads arranged around a lower edge of the flexible integrated circuit die in a particular pattern, each landing pad coupled to a corresponding one of a plurality of solder balls coupled to the substrate in the particular pattern.

4. The flexibly-wrapped integrated circuit device of claim 1, wherein the tube comprises a heat sink material.

5. The flexibly-wrapped integrated circuit device of claim 1, wherein the tube comprises a metal surfaced material.

6. The flexibly-wrapped integrated circuit device of claim 1, wherein the tube is mechanically coupled to the flexible integrated circuit die.

7. A flexibly-wrapped integrated circuit die device comprising:
    a substrate;
    an integrated circuit die coupled to the substrate;
    a flexible integrated circuit die, the flexible integrated circuit die coupled to the substrate in a substantially vertical orientation with reference to a surface of the substrate wherein the flexible integrated circuit die substantially peripherally encircles the integrated circuit die; and
    alignment pillars coupled to the substrate and configured to act as heat sinks for the flexible integrated circuit die.

* * * * *